United States Patent
Wu et al.

(10) Patent No.: US 9,431,111 B2
(45) Date of Patent: Aug. 30, 2016

(54) ONE TIME PROGRAMMING MEMORY CELL, ARRAY STRUCTURE AND OPERATING METHOD THEREOF

(71) Applicant: eMemory Technology Inc., Hsin-Chu (TW)

(72) Inventors: Meng-Yi Wu, Hsinchu County (TW); Hsin-Ming Chen, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/515,902

(22) Filed: Oct. 16, 2014

(65) Prior Publication Data

US 2016/0013193 A1 Jan. 14, 2016

Related U.S. Application Data

(60) Provisional application No. 62/022,166, filed on Jul. 8, 2014.

(51) Int. Cl.
*G11C 17/00* (2006.01)
*G11C 16/08* (2006.01)
(Continued)

(52) U.S. Cl.
CPC ............... *G11C 16/08* (2013.01); *G11C 16/10* (2013.01); *G11C 16/26* (2013.01); *G11C 17/04* (2013.01); *G11C 17/08* (2013.01); *G11C 17/146* (2013.01); *G11C 17/16* (2013.01); *G11C 17/18* (2013.01); *G11C 29/76* (2013.01); *H01L 23/528* (2013.01); *H01L 27/0629* (2013.01); *H01L 27/11206* (2013.01); *H01L 27/11524* (2013.01);
(Continued)

(58) Field of Classification Search
CPC ....... G11C 17/16; G11C 17/18; G11C 17/14; G11C 17/143; G11C 17/165; G11C 2229/763; G11C 2229/766; G11C 29/027
USPC .................................................. 365/96, 225.7
See application file for complete search history.

(56) References Cited

U.S. PATENT DOCUMENTS

6,798,693 B2 9/2004 Peng
6,822,888 B2 11/2004 Peng
(Continued)

FOREIGN PATENT DOCUMENTS

EP 2439746 A1 4/2012
JP 2012043970 3/2012

OTHER PUBLICATIONS

Shen et al. "A high-density logic CMOS process compatible non-volatile memory for sub-28nm technologies", pp. 1-2, pub. Date, Jun. 9, 2014, VLSI Technology (VLSI-Technology): Digest of Technical Papers, 2014 Symposium on, Honolulu, HI, USA.
(Continued)

*Primary Examiner* — Huan Hoang
(74) *Attorney, Agent, or Firm* — WPAT, PC; Justin King

(57) ABSTRACT

A one time programming memory cell includes a transistor, a first varactor, and a second varactor. The transistor has a gate terminal, a source terminal and a drain terminal. The gate terminal of the transistor is connected with a word line. The source terminal of the transistor is connected with a bit line. A first end of the first varactor is connected with the drain terminal of the transistor. A second end of the first varactor is connected with a first program line. A first end of the second varactor is connected with the drain terminal of the transistor. A second end of the second varactor is connected with a second program line.

2 Claims, 16 Drawing Sheets

(51) Int. Cl.
| | | |
|---|---|---|
| *G11C 17/16* | (2006.01) | |
| *G11C 17/18* | (2006.01) | |
| *H01L 27/112* | (2006.01) | |
| *G11C 16/10* | (2006.01) | |
| *G11C 16/26* | (2006.01) | |
| *G11C 17/04* | (2006.01) | |
| *G11C 17/08* | (2006.01) | |
| *H01L 23/528* | (2006.01) | |
| *H01L 27/06* | (2006.01) | |
| *H01L 29/10* | (2006.01) | |
| *H01L 29/49* | (2006.01) | |
| *H01L 29/93* | (2006.01) | |
| *H01L 27/115* | (2006.01) | |
| *H03K 3/356* | (2006.01) | |
| *G11C 17/14* | (2006.01) | |
| *G11C 29/00* | (2006.01) | |
| *H01L 23/525* | (2006.01) | |

(52) U.S. Cl.
CPC ....... *H01L29/1079* (2013.01); *H01L 29/4916* (2013.01); *H01L 29/93* (2013.01); *H03K 3/356182* (2013.01); *H01L 23/5252* (2013.01)

(56) References Cited

U.S. PATENT DOCUMENTS

2012/0087170 A1     4/2012   Lu et al.
2014/0098591 A1*    4/2014   Chen ..................... G11C 17/18
                                                          365/96

OTHER PUBLICATIONS

European Patent Office "Search Report" issued on Nov. 27, 2015.
Japan Patent Office, "Office Action" issued Apr. 26, 2016.

* cited by examiner ively. A second end of the fourth varactor
ONE TIME PROGRAMMING MEMORY CELL, ARRAY STRUCTURE AND OPERATING METHOD THEREOF This application claims the benefit of U.S. provisional patent application No. 62/022,166, filed Jul. 8, 2014, the subject matter of which is incorporated herein by reference.

FIELD OF THE INVENTION

The present invention relates to a non-volatile memory cell, and more particularly to a one time programming memory cell, an array structure and an operating method thereof.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the non-volatile memory.

According to the number of times the non-volatile memory is programmed, the non-volatile memories may be classified into a multi-time programming memory (also referred as a MTP memory), a one time programming memory (also referred as an OTP memory) and a mask read only memory (also referred as a Mask ROM).

Generally, the MTP memory may be programmed many times, and the stored data of the MTP memory may be modified many times. On the contrary, the OTP memory may be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

Moreover, depending on the characteristics, the OTP memories may be classified into two types, i.e. a fuse type OTP memory and an anti-fuse type OTP memory. Before a memory cell of the fuse type OTP memory is programmed, the memory cell has a low-resistance storage state. After the memory cell of the fuse type OTP memory is programmed, the memory cell has a high-resistance storage state.

On the other hand, the memory cell of the anti-fuse type OTP memory has the high-resistance storage state before programmed, and the memory cell of the anti-fuse type OTP memory has the low-resistance storage state after programmed.

With increasing advance of the semiconductor manufacturing process, the process of manufacturing the OTP memory is compatible with the CMOS semiconductor manufacturing process. Since the CMOS semiconductor manufacturing process is continuously in progress, there is a need of providing an improved structure of an OTP memory in order to achieve more reliable performance of the OTP memory.

SUMMARY OF THE INVENTION

The present invention provides a one time programming memory cell, an array structure and an operating method in order to achieve the in-cell 100% redundancy efficacy.

An embodiment of the present invention provides a one time programming memory cell. The one time programming memory cell includes a P-type substrate, a first gate structure, a second gate structure, a third gate structure, a first N-type diffusion region, and a second N-type diffusion region. The first gate structure is disposed on a surface of the P-type substrate and connected with a word line. The second gate structure is disposed on the surface of the P-type substrate and connected with a first program line. The third gate structure is disposed on the surface of the P-type substrate and connected with a second program line. The first N-type diffusion region is disposed under the surface of the P-type substrate, located near a first side of the first gate structure, and connected with a bit line. The second N-type diffusion region is disposed under the surface of the P-type substrate. The second N-type diffusion region is located near a second side of the first gate structure, a first side of the second gate structure and a first side of the third gate structure. A channel region underlying the second gate structure is a first N-type doped channel region. A channel region underlying the third gate structure is a second N-type doped channel region. A first varactor is defined by the second gate structure, the first N-type doped channel region and the second N-type diffusion region collaboratively. A second varactor is defined by the third gate structure, the second N-type doped channel region and the second N-type diffusion region collaboratively. A transistor is defined by the first gate structure, the P-type substrate, the first N-type diffusion region and the second N-type diffusion region collaboratively.

Another embodiment of the present invention provides a one time programming memory cell. The one time programming memory cell includes a transistor, a first varactor, and a second varactor. The transistor has a gate terminal, a source terminal and a drain terminal. The gate terminal of the transistor is connected with a word line. The source terminal of the transistor is connected with a bit line. A first end of the first varactor is connected with the drain terminal of the transistor. A second end of the first varactor is connected with a first program line. A first end of the second varactor is connected with the drain terminal of the transistor. A second end of the second varactor is connected with a second program line.

A further embodiment of the present invention provides an array structure. The array structure includes a first one time programming memory cell and a second one time programming memory cell. The first one time programming memory cell includes a first transistor, a first varactor, and a second varactor. The first transistor has a gate terminal, a source terminal and a drain terminal. The gate terminal of the first transistor is connected with a first word line. The source terminal of the first transistor is connected with a first bit line. A first end of the first varactor is connected with the drain terminal of the first transistor. A second end of the first varactor is connected with a first program line. A first end of the second varactor is connected with the drain terminal of the first transistor. A second end of the second varactor is connected with a second program line. The second one time programming memory cell includes a second transistor, a third varactor, and a fourth varactor. The second transistor includes a gate terminal, a source terminal and a drain terminal. The gate terminal of the second transistor is connected with a second word line. The source terminal of the second transistor is connected with the first bit line. A first end of the third varactor is connected with the drain terminal of the second transistor. A second end of the third varactor is connected with the first program line. A first end of the fourth varactor is connected with the drain terminal of the second transistor. A second end of the fourth varactor is connected with the second program line.

A further embodiment of the present invention provides an operating method of the array structure. A first program process is performed to turn the first varactor of the first one time programming memory cell into a first resistor. A verification process is performed to read a first read current of the first one time programming memory cell. If the first one time programming memory cell is verified as a failed memory cell, a second program process is performed to turn the second varactor of the first one time programming memory cell into a second resistor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
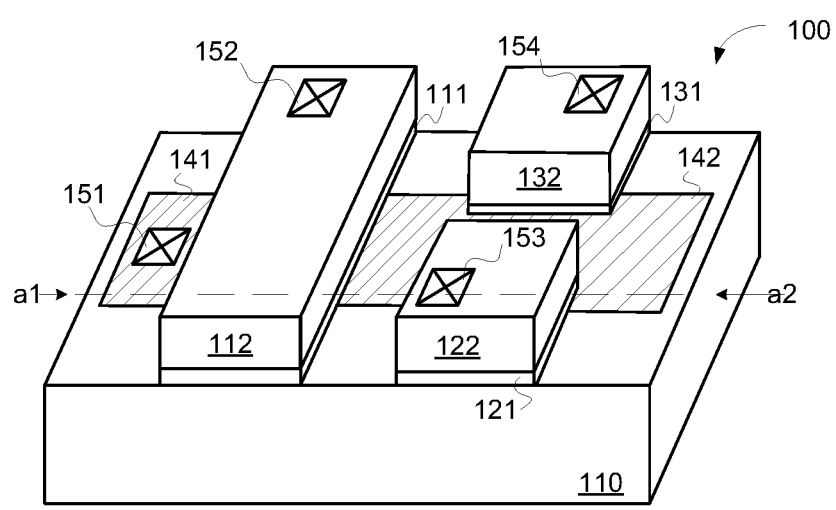
FIGS. 1A~1D schematically illustrate the structure and the equivalent circuit of an OTP memory cell according to a first embodiment of the present invention.
Figure 1B:
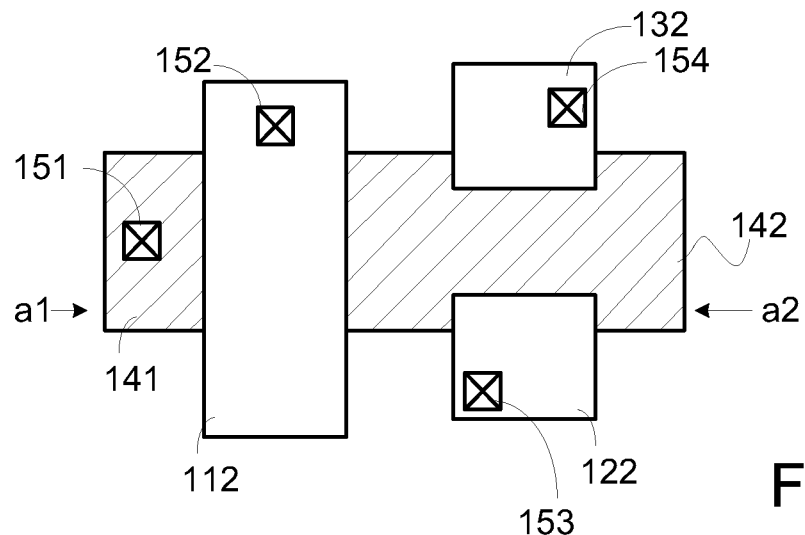
Figure 1C:
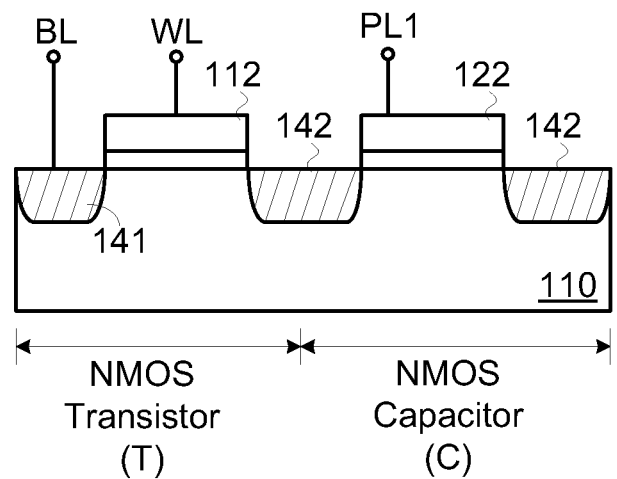
Figure 1D:
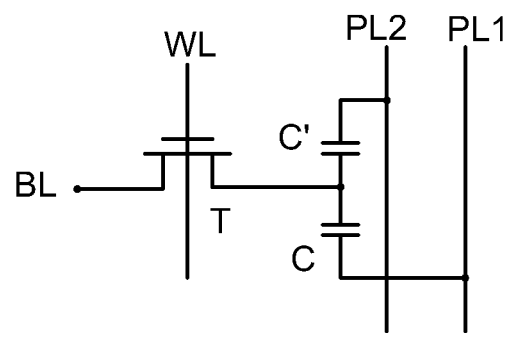

FIGS. 1A~1D schematically illustrate the structure and the equivalent circuit of an OTP memory cell according to a first embodiment of the present invention. FIG. 1A is a schematic perspective view of the OTP memory cell according to the first embodiment of the present invention. FIG. 1B is a schematic top view of the OTP memory cell of FIG. 1A. FIG. 1O is a schematic cross-sectional view of the OTP memory cell of FIG. 1A and taken along a direction (a1-a2). FIG. 1D is a schematic equivalent circuit diagram of the OTP memory cell according to the first embodiment of the present invention.

Please refer to FIG. 1A. The OTP memory cell 100 has a substrate with a P-well region 110. A first gate structure, a second gate structure and a third gate structure are formed over the P-well region 110. The first gate structure comprises a gate oxide layer 111 and a first polysilicon gate 112 overlying the gate oxide layer 111. The second gate structure comprises a gate oxide layer 121 and a second polysilicon gate 122 overlying the gate oxide layer 121. The third gate structure comprises a gate oxide layer 131 and a third polysilicon gate 132 overlying the gate oxide layer 131.

Please refer to FIG. 1B. After an ion implantation process is performed by using the three gate structures as the implantation masks, a first N+ diffusion region 141 and a second N+ diffusion region 142 are formed in the P-well region 110. The first N+ diffusion region 141 is located near a side of the first gate structure. The second N+ diffusion region 142 is located near another side of the first gate structure. Moreover, a first contact 151 is formed on the first N+ diffusion region 141, a second contact 152 is formed on the first polysilicon gate 112, a third contact 153 is formed on the second polysilicon gate 122, and a fourth contact 154 is formed on the third polysilicon gate 132.

Please refer to FIG. 1O. After a metal line forming process is performed, the first contact 151 is connected with a bit line BL, the second contact 152 is connected with a word line WL, the third contact 153 is connected with a first program line PL1, and the fourth contact 154 is connected with a second program line PL2.

Moreover, as shown in FIG. 1O, the first N+ diffusion region 141, the first gate structure and the second N+ diffusion region 142 are collaboratively defined as an N-type metal-oxide semiconductor (NMOS) transistor T, and the second gate structure and the second N+ diffusion region 142 are collaboratively defined as an N-type metal-oxide semiconductor (NMOS) capacitor C. Similarly, the third gate structure and the second N+ diffusion region 142 are collaboratively defined as another NMOS capacitor C' (not shown).

Please refer to FIG. 1D. The gate terminal of the NMOS transistor T is connected with the word line WL. The first N+ diffusion region 141 of the NMOS transistor T is connected with the bit line BL. The second N+ diffusion region 142 of the NMOS transistor T is connected with a first end of the NMOS capacitor C and a first end of the NMOS capacitor C'. A second end of the NMOS capacitor C is connected with the first program line PL1. A second end of the NMOS capacitor C' is connected with the second program line PL2.

Moreover, as shown in FIG. 10, the channel regions under the second gate structure and the third gate structure of the two NMOS capacitors C and C' are P-well regions. Consequently, after proper positive bias voltages are provided to the second gate structure and the third gate structure, the two NMOS capacitors C and C' have capacitance values.

With increasing advance of the semiconductor manufacturing process, the structure of the OTP memory cell of the first embodiment may be further altered. For example, after a channel cancellation process is performed, the two NMOS capacitors C and C' are turned into two varactors. The channel cancellation process is for example a source/drain extension process, a well forming process or an ion implantation process, which will be illustrated in more details as follows.

Figure 2A:
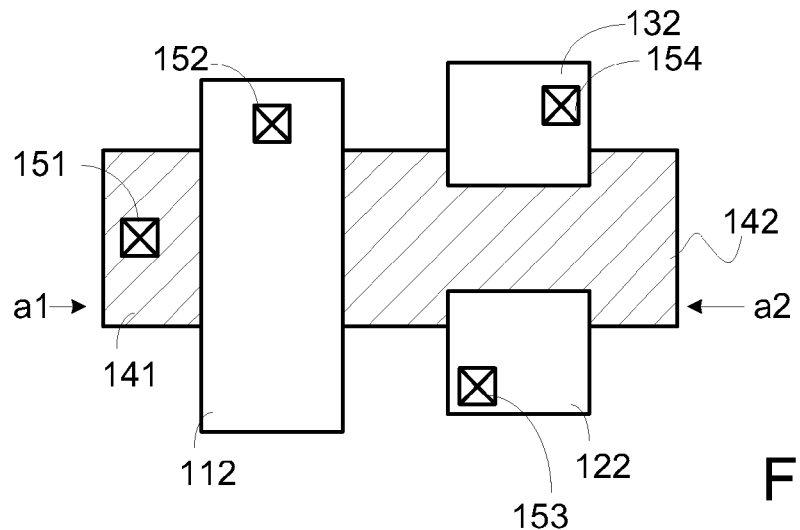
FIGS. 2A~2C schematically illustrate the structure and the equivalent circuit of an OTP memory cell according to a second embodiment of the present invention.
Figure 2B:
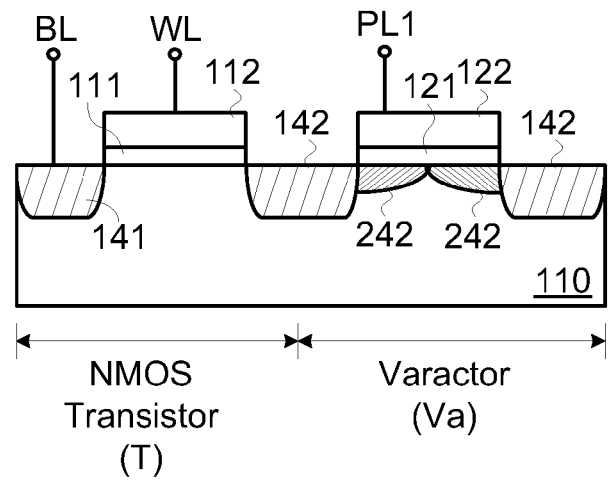
Figure 2C:
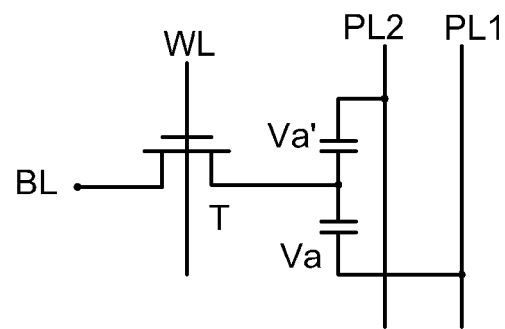

FIGS. 2A~2C schematically illustrate the structure and the equivalent circuit of an OTP memory cell according to a second embodiment of the present invention. FIG. 2A is a schematic top view of the OTP memory cell according to the second embodiment of the present invention. FIG. 2B is a schematic cross-sectional view of the OTP memory cell of FIG. 2A and taken along a direction (a1-a2). FIG. 2C is a schematic equivalent circuit diagram of the OTP memory cell according to the second embodiment of the present invention. The perspective view of the OTP memory cell of the second embodiment is similar to that of the OTP memory cell of the first embodiment, and is not redundantly described herein.

After the OTP memory cell of the first embodiment is fabricated, the NMOS transistor T is masked, and the NMOS capacitor C is subjected to a source/drain extension process. After the source/drain extension process is performed, two N-type extension regions 242 are formed in the channel region underlying the second gate structure. Also, combination of the two N-type extension regions 242 is called N-type doped channel region. Generally, if the length of the P-type channel is shorter than 40 nm, the two N-type extension regions 242 are merged together and the P-type channel is vanished. Consequently, as shown in FIG. 2B, the second gate structure and the N-type extension regions 242 are collaboratively defined as a varactor Va. Under this circumstance, the varactor Va has an electrically-controllable capacitance value without the need of providing a positive bias voltage to the second gate structure. Thus varactor type anti-fuse cell has better performance than a MOS-capacitor after gate oxide is ruptured. Similarly, the third gate structure and the N-type extension regions 242 are collaboratively defined as another varactor Va'.

Please refer to FIG. 2C. The gate terminal of the NMOS transistor T is connected with the word line WL. The first N+ diffusion region 141 of the NMOS transistor T is connected with the bit line BL. The second N+ diffusion region 142 of the NMOS transistor T is connected with a first end of the varactor Va and a first end of the varactor Va'. A second end of the varactor Va is connected with the first program line PL1. A second end of the varactor Va' is connected with the second program line PL2.

Figure 3:
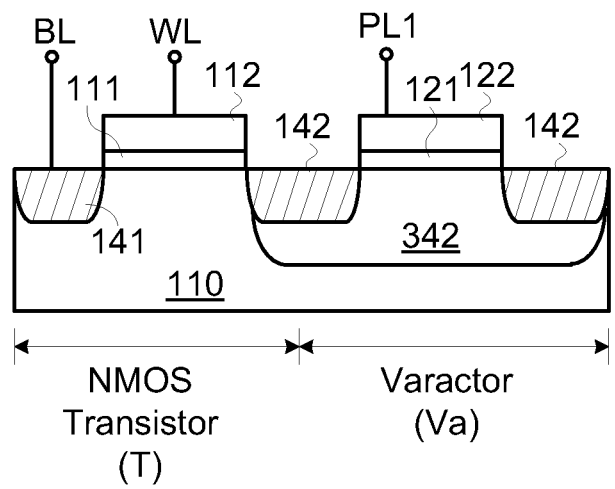
FIG. 3 is a schematic cross-sectional view of an OTP memory cell according to a third embodiment of the present invention.

FIG. 3 is a schematic cross-sectional view of an OTP memory cell according to a third embodiment of the present invention. The top view and the equivalent circuit diagram of the OTP memory cell of this embodiment are similar to those of the OTP memory cell of the second embodiment, and are not redundantly described herein.

After the OTP memory cell of the first embodiment is fabricated, the NMOS transistor T is masked, and the NMOS capacitor C is subjected to an N-well forming process. After the N-well forming process is performed, the channel region underlying the second gate structure is replaced by an N-well region 342, and the P-type channel is vanished. Also, the N-well region 342 is called N-type doped channel region. Consequently, as shown in FIG. 3, the second gate structure and the N-well region 342 are collaboratively defined as a varactor Va. Similarly, the channel region underlying the third gate structure is replaced by the N-well region 342, and the P-type channel is vanished. Consequently, the third gate structure and the N-well region 342 are collaboratively defined as another varactor Va' (not shown).

Figure 4:
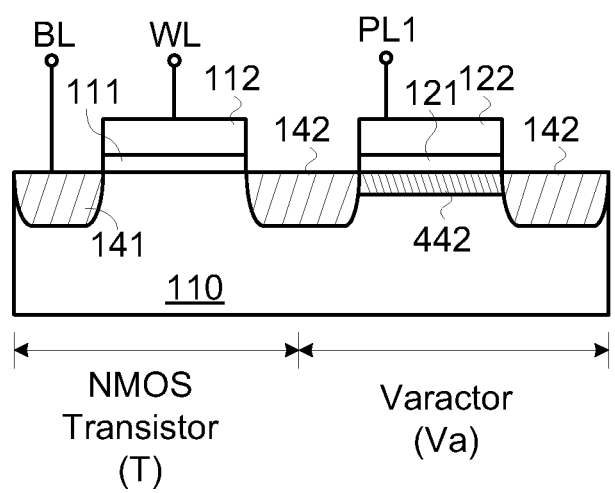
FIG. 4 is a schematic cross-sectional view of an OTP memory cell according to a fourth embodiment of the present invention.

FIG. 4 is a schematic cross-sectional view of an OTP memory cell according to a fourth embodiment of the present invention. The top view and the equivalent circuit diagram of the OTP memory cell of this embodiment are similar to those of the OTP memory cell of the second embodiment, and are not redundantly described herein.

After the OTP memory cell of the first embodiment is fabricated, the NMOS transistor T is masked, and the NMOS capacitor C is subjected to an N-type ion implantation process. After the N-type ion implantation process is performed, the channel region underlying the second gate structure is replaced by an N-type doped region 442, and the P-type channel is vanished. Also, the N-type doped region 442 is called N-type doped channel region. Consequently, as shown in FIG. 4, the second gate structure and the N-type doped region 442 are collaboratively defined as a varactor Va. Similarly, the channel region underlying the third gate structure is replaced by another N-type doped region, and the P-type channel is vanished. Consequently, the third gate structure and the N-type doped region are collaboratively defined as another varactor Va' (not shown).

Figure 5:
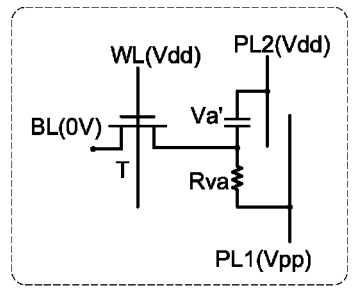
FIG. 5 schematically illustrates associated control signals for programming an OTP memory cell of the present invention.

FIG. 5 schematically illustrates associated control signals for programming an OTP memory cell of the present invention. In the case that the OTP memory cell of FIG. 5 is the selected memory cell during the program cycle, the voltage Vdd is provided to the word line WL, the zero voltage (0V) is provided to the bit line BL, the voltage Vpp is provided to one program line, and the voltage Vdd is provided to another program line. For example, the voltage Vpp is provided to the first program line PL1, and the voltage Vdd is provided to the second program line PL2. In an embodiment, the magnitude of the voltage Vpp is 6V, and the magnitude of the voltage Vdd is in the range between 1V and 2.8V.

Please refer to FIG. 5 again. During the program cycle, the voltage difference between both ends of the varactor Va is equal to Vpp. Since the gate oxide layer of the varactor Va is ruptured by this voltage difference, the varactor Va is turned into a low-resistance resistor Rva. Moreover, the voltage difference between the varactor Va' is equal to Vdd. Since the varactor Va' can withstand this voltage difference, the gate oxide layer of the varactor Va' is not ruptured.

After the program cycle, the selected memory cell is turned into a programmed memory cell. The programmed memory cell has the low-resistance resistor Rva. On the other hand, the un-selected memory cell is turned into the non-programmed memory cell. Since the gate oxide layers of the varactors Va and Va' are not ruptured, the varactors Va and Va' may be considered as high-resistance varactors.

Figure 6A:
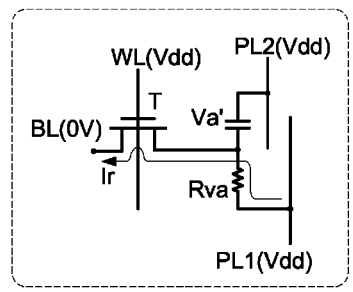
FIG. 6A schematically illustrates associated control signals for reading a programmed memory cell of the present invention.
Figure 6B:
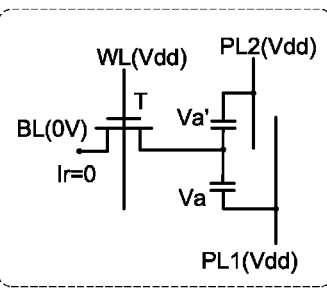
FIG. 6B schematically illustrates associated control signals for reading a non-programmed memory cell of the present invention.

FIG. 6A schematically illustrates associated control signals for reading a programmed memory cell of the present invention. FIG. 6B schematically illustrates associated control signals for reading a non-programmed memory cell of the present invention. During the read cycle, the voltage Vdd is provided to the word line WL, the zero voltage (0V) is provided to the bit line BL, and the voltage Vdd is provided to both of the first program line PL1 and the second program line PL2. It is to be noted that the word line WL, the first program line PL1 and the second line PL2 may also be biased with different voltage levels when reading a memory cell of the present invention.

Since the memory cell shown in FIG. 6A is the programmed memory cell, the bit line BL generates a higher read current Ir. Whereas, since the memory cell shown in FIG. 6B is the non-programmed memory cell, the bit line BL generates a lower read current Ir (e.g. Ir=0 A). Consequently, the storage state of the OTP memory cell may be realized according to the magnitude of the read current Ir. If the read current Ir is higher than a reference current, the OTP memory cell has a first storage state. Whereas, if the read current Ir is lower than the reference current, the OTP memory cell has a second storage state.

During the program cycle, if the gate oxide layer cannot be successfully ruptured, the program process fails. Under this circumstance, the memory cell is turned into a failed memory cell. The failed memory cell has a higher resistance value. During the process of reading the failed memory cell, the storage state of the failed memory cell is often erroneously judged because the read current Ir is low.

Figure 7A:
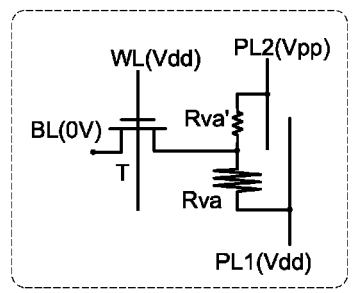
FIG. 7A schematically illustrates associated control signals for remedying a failed memory cell according to present invention.
Figure 7B:
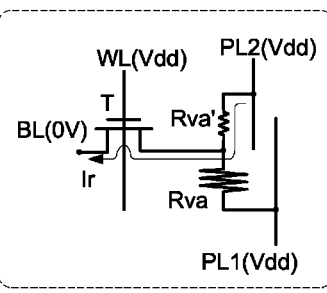
FIG. 7B schematically illustrates associated control signals for reading the remedied memory cell according to present invention.

Since the OTP memory cell of the present invention has two varactors, the failed memory cell may be remedied during a re-program cycle (i.e. a second program cycle). FIG. 7A schematically illustrates associated control signals for remedying (or re-programming) a failed memory cell according to present invention. FIG. 7B schematically illustrates associated control signals for reading the remedied (or re-programmed) memory cell according to present invention.

Since the OTP memory cell shown in FIG. 7A is considered as the failed memory cell, the OTP memory cell has a high-resistance resistor Rva. During the re-program cycle (i.e. the second program cycle), the voltage Vdd is provided to the word line WL, the zero voltage (0V) is provided to the bit line BL, the voltage Vpp is provided to the second program line PL2, and the voltage Vdd is provided to the first program line PL1. During the re-program cycle (i.e. the second program cycle), the voltage difference between both ends of the varactor Va' is equal to Vpp. Since the gate oxide layer of the varactor Va' is ruptured by this voltage difference, the varactor Va' is turned into a low-resistance resistor Rva'.

Please refer to FIG. 7B. During the read cycle, the voltage Vdd is provided to the word line WL, the zero voltage (0V) is provided to the bit line BL, and the voltage Vdd is provided to both of the first program line PL1 and the second program line PL2. Consequently, the bit line BL generates a higher read current Ir. According to the higher read current Ir, the memory cell is verified to have the first storage state.

From the above descriptions, the OTP memory cell of the present invention comprises two varactors. By means of the two varactors, the in-cell 100% redundancy efficacy can be achieved.

Figure 8A:
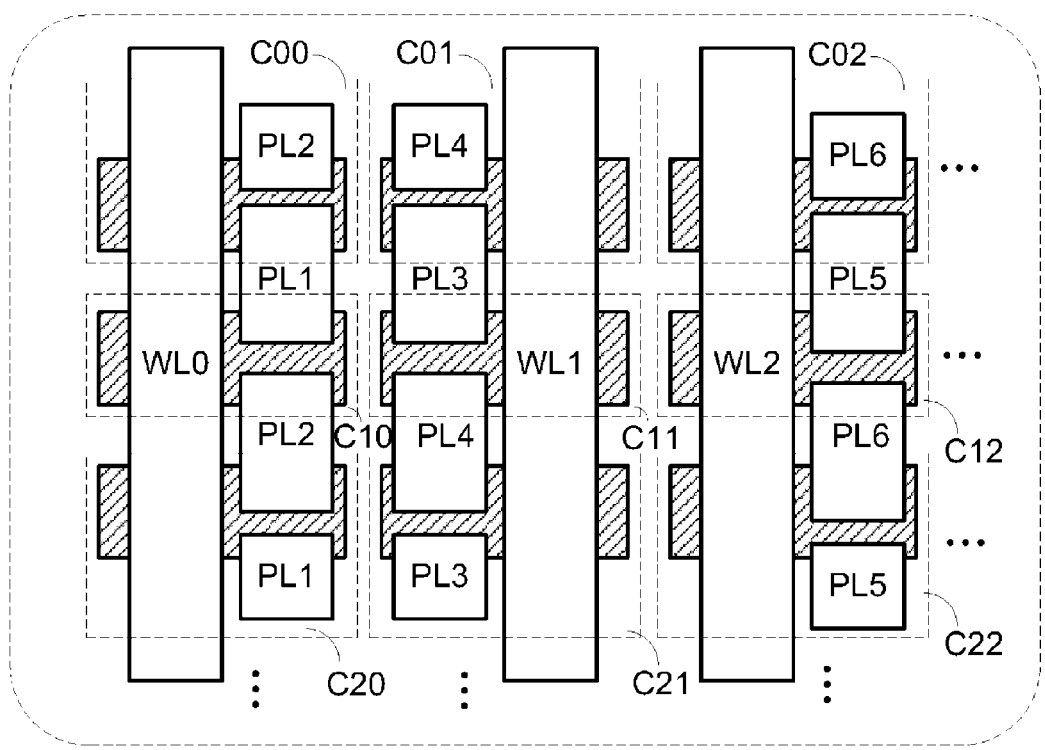
FIG. 8A is a schematic top view illustrating the layout of an array structure of OTP memory cells according to a first embodiment of the present invention.
Figure 8B:
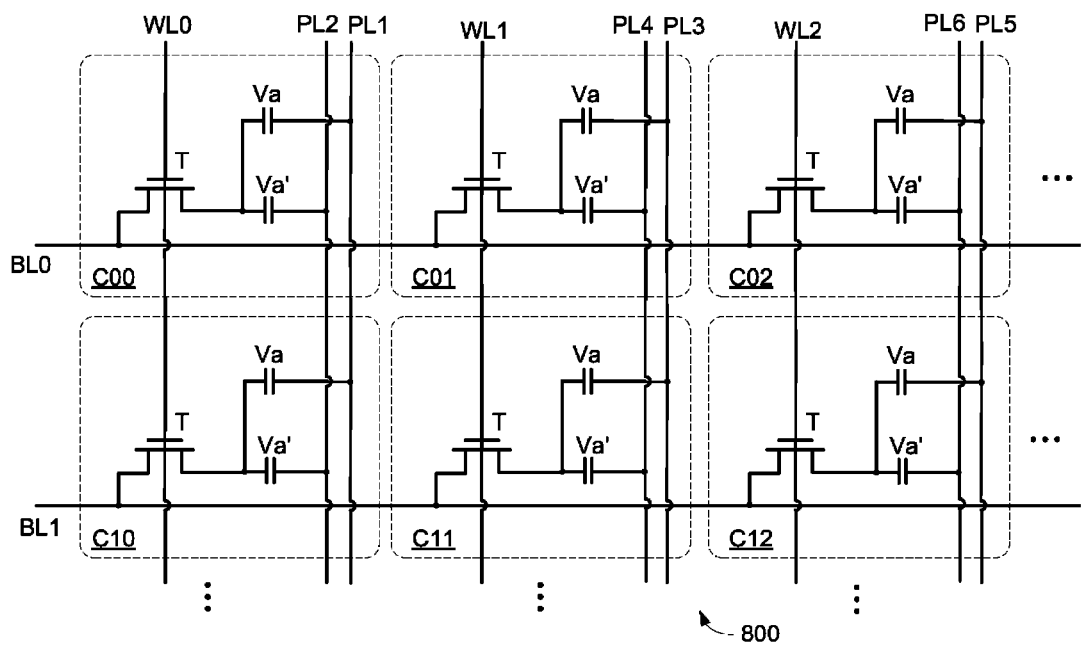
FIG. 8B is a schematic equivalent circuit diagram of the array structure of FIG. 8A.

FIG. 8A is a schematic top view illustrating the layout of an array structure of OTP memory cells according to a first embodiment of the present invention. FIG. 8B is a schematic equivalent circuit diagram of the array structure of FIG. 8A.

In FIG. 8A, each OTP memory cell is circumscribed by a dotted rectangle. Like the OTP memory cell of FIG. 2A, each OTP memory cell comprises two N+ diffusion regions, a first gate structure, a second gate structure, and a third gate structure. For example, in the OTP memory cell C00, the first polysilicon gate of the first gate structure is connected with the word line WL0, the second polysilicon gate of the second gate structure is connected with the first program line PL1, and the third polysilicon gate of the third gate structure is connected with the second program line PL2.

Moreover, the first polysilicon gates of the first gate structures of the OTP memory cells C00, C10 and C20 are combined together and connected with the word line WL0. The second polysilicon gates of the second gate structures of the OTP memory cells C00 and C10 are combined together and connected with the first program line PL1. The third polysilicon gates of the third gate structures of the OTP memory cells C10 and C20 are combined together and connected with the second program line PL2.

After the structure of FIG. 8A is produced, a channel cancellation process is performed. The channel cancellation process is for example a source/drain extension process, a well forming process or an ion implantation process. After the channel cancellation process is performed, the channel regions of the second gate structures and the third gate structures are cancelled, and the NMOS capacitors are turned into varactors. Consequently, the array structure of this embodiment is manufactured.

As shown in FIG. 8B, the array structure 800 comprises plural OTP memory cells C00~C12. Each OTP memory cell comprises an NMOS transistor T, a first varactor Va, and a second varactor Va'. In OTP memory cells C00 and C10, a first end of the varactor Va and a first end of the varactor Va' are connected with a drain terminal of the NMOS transistor T. A second end of the first varactor Va is connected with the first program line PL1. A second end of the second varactor Va' is connected with the second program line PL2. In OTP memory cells C01 and C11, a first end of the varactor Va and a first end of the varactor Va' are connected with a drain terminal of the NMOS transistor T. A second end of the first varactor Va is connected with the third program line PL3. A second end of the second varactor Va' is connected with the fourth program line PL4. In OTP memory cells C02 and C12, a first end of the varactor Va and a first end of the varactor Va' are connected with a drain terminal of the NMOS transistor T. A second end of the first varactor Va is connected with the fifth program line PL5. A second end of the second varactor Va' is connected with the six program line PL6.

The gate terminals of the NMOS transistors T of the OTP memory cells C00 and C10 are connected with the word line WL0. The gate terminals of the NMOS transistors T of the OTP memory cells C01 and C11 are connected with the word line WL1. The gate terminals of the NMOS transistors T of the OTP memory cells C02 and C12 are connected with the word line WL2. Moreover, the source terminals of the NMOS transistors T of the OTP memory cells C00, C01 and C02 are connected with the bit line BL0, and the source terminals of the NMOS transistors T of the OTP memory cells C10, C11 and C12 are connected with the bit line BL1. In this embodiment, the OTP memory cells of the array structure are arranged in a 2×3 array. It is noted that the OTP memory cells of the array structure may be arranged in an m×n array, wherein m and n are positive integers.

During a first program cycle, a voltage Vpp is provided to the first program line PL1, the third program line PL3 and the fifth program line PL5, and a voltage Vdd is provided to the second program line PL2, the fourth program line PL4 and the sixth program line PL6. During a second program cycle, the voltage Vdd is provided to the first program line PL1, the third program line PL3 and the fifth program line PL5, and the voltage Vpp is provided to the second program line PL2, the fourth program line PL4 and the sixth program line PL6. Moreover, when the word line WL and the bit line BL corresponding to a specified OTP memory cell receive the voltage Vdd and the zero voltage (0V), respectively, the specified OTP memory cell is a selected memory cell.

Figure 9A:
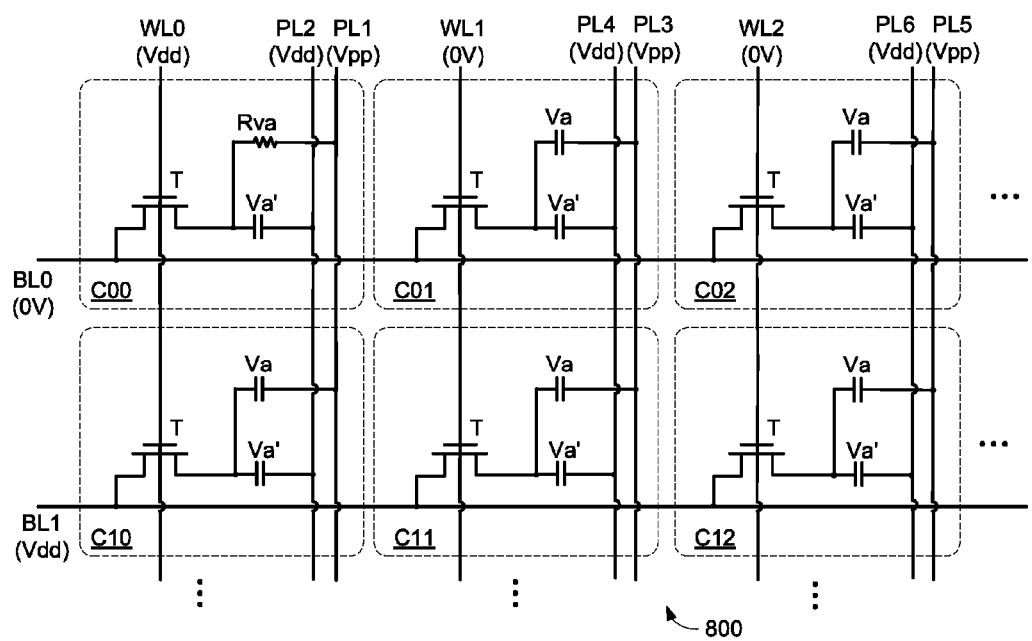
FIGS. 9A~9C schematically illustrate the procedures of programming the OTP memory cells C00, C11 and C02 during the first program cycle.
Figure 9B:
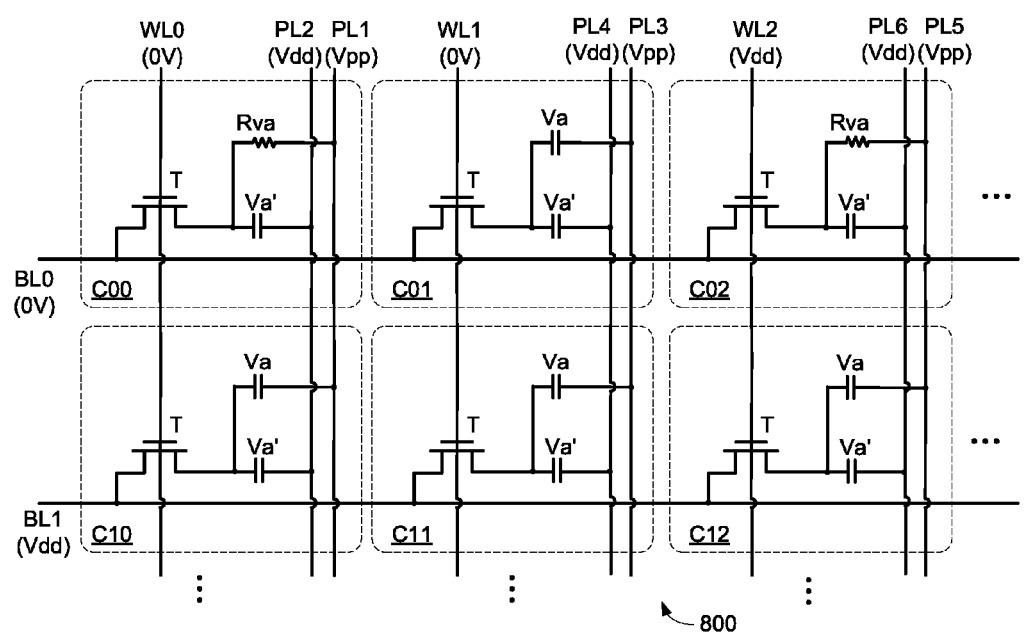
Figure 9C:
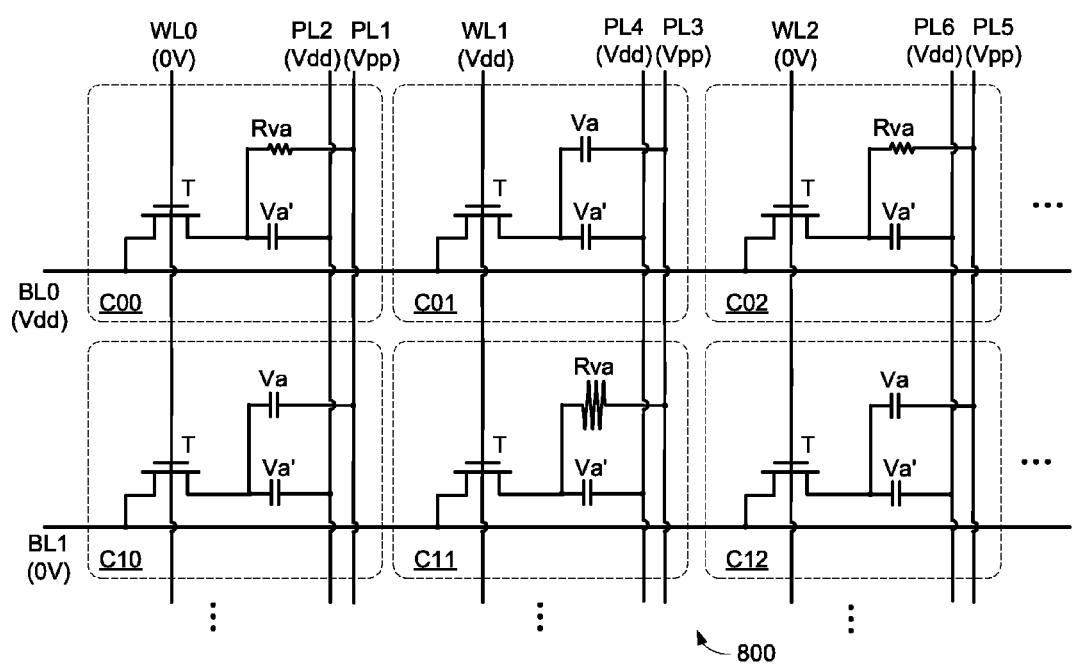

FIGS. 9A~9C schematically illustrate the procedures of programming the OTP memory cells C00, C11 and C02 during the first program cycle. In an embodiment, the magnitude of the voltage Vpp is 6V, and the magnitude of the voltage Vdd is in the range between 1V and 3.6V.

As shown in FIG. 9A, the voltage Vdd is provided to word line WL0, and 0V is provided to the word lines WL1 and WL2. Moreover, 0V is provided to the bit line BL0, and the voltage Vdd is provided to the bit line BL1. In other words, the OTP memory cell C00 is the selected memory cell, but the other OTP memory cells are the un-selected memory cells. Meanwhile, as shown in FIG. 9A, the varactor Va of the OTP memory cell C00 is turned into a resistor Rva. That is, the OTP memory cell C00 is a programmed memory cell.

As shown in FIG. 9B, the voltage Vdd is provided to word line WL2, and 0V is provided to the word lines WL0 and WL1. Moreover, 0V is provided to the bit line BL0, and the voltage Vdd is provided to the bit line BL1. In other words, the OTP memory cell C02 is the selected memory cell, but the remaining OTP memory cells are the un-selected memory cells. Meanwhile, as shown in FIG. 9B, the varactor Va of the OTP memory cell C02 is turned into a resistor Rva. That is, the OTP memory cell C02 is a programmed memory cell.

As shown in FIG. 9C, the voltage Vdd is provided to word line WL1, and 0V is provided to the word lines WL0 and WL2. Moreover, the voltage Vdd is provided to the bit line BL0, and 0V is provided to the bit line BL1. In other words, the OTP memory cell C11 is the selected memory cell, but the remaining OTP memory cells are the un-selected memory cells. Meanwhile, as shown in FIG. 9C, the varactor Va of the OTP memory cell C11 is turned into a resistor Rva. That is, the OTP memory cell C11 is a programmed memory cell.

After the first program cycle, the OTP memory cells C00, C11 and C02 are the programmed memory cells. Then, it is necessary to verify the storage states of the programmed memory cells. In particular, during a verification cycle, the storage states of all OTP memory cells are read and verified, so that the failed memory cells are searched.

During the verification cycle, the voltage Vdd is provided to the first program line PL1, the second program line PL2, the third program line PL3, the fourth program line PL4, the fifth program line PL5, and the sixth program line PL6. Moreover, when the word line WL and the bit line BL corresponding to a specified OTP memory cell receive the voltage Vdd and the zero voltage (0V), respectively, the specified OTP memory cell is a selected memory cell. In addition, the selected memory cell generates a read current.

Figure 10A:
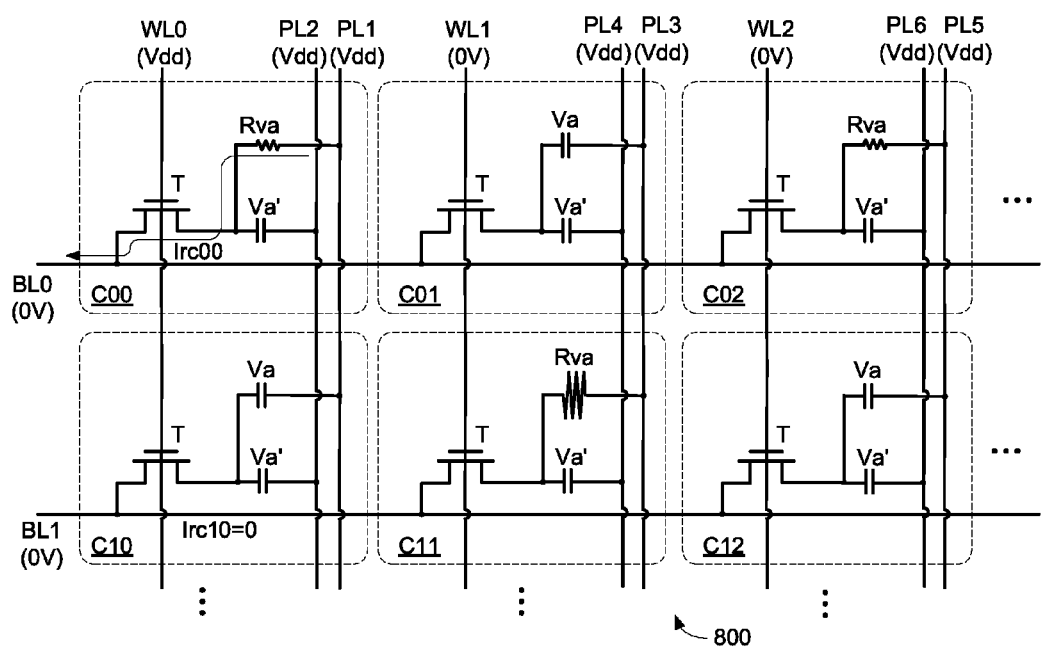
FIGS. 10A~10C schematically illustrate the procedures of reading all of the OTP memory cells during the verification cycle.
Figure 10B:
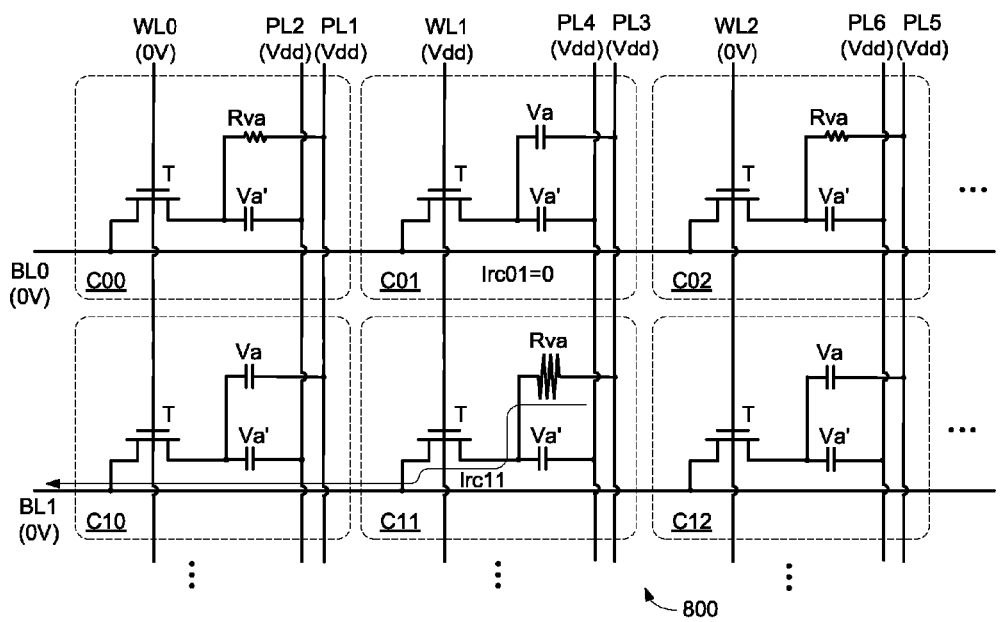
Figure 10C:
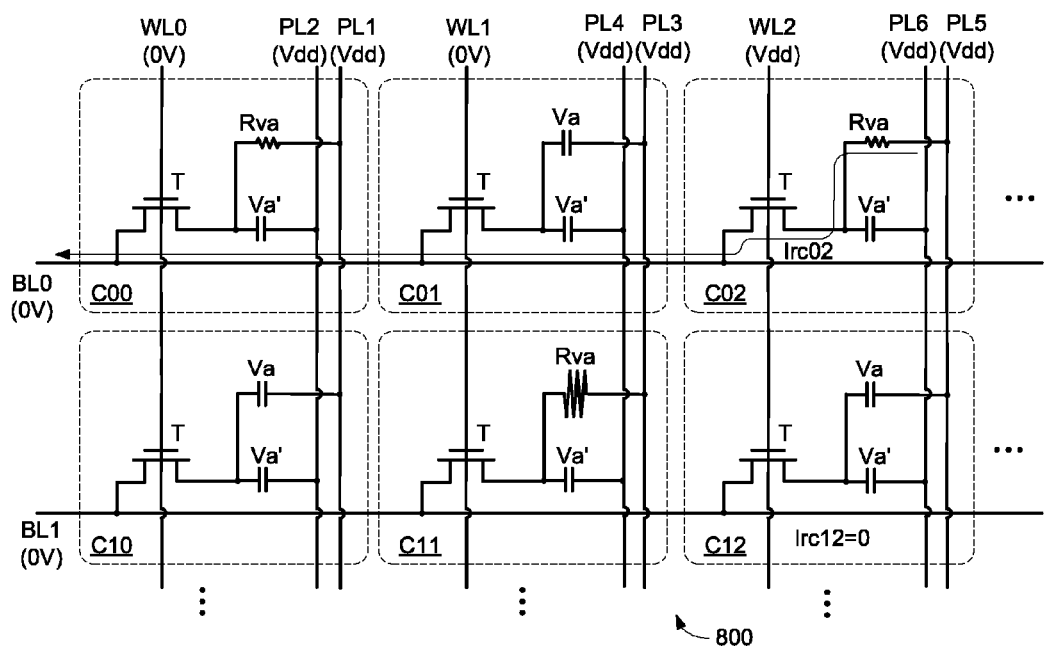

FIGS. 10A~10C schematically illustrate the procedures of reading all of the OTP memory cells during the verification cycle. For example, the OTP memory cell C11 is the failed memory cell.

As shown in FIG. 10A, the voltage Vdd is provided to word line WL0, and 0V is provided to the word lines WL1 and WL2. Moreover, 0V is provided to the bit lines BL0 and BL1. In other words, the OTP memory cells C00 and C10 are the selected memory cells. Since the OTP memory cell C00 generates the higher read current Irc00 to the bit line BL0, the OTP memory cell C00 is verified to have the first storage state. Whereas, since the OTP memory cell C00 does not generate the read current to the bit line BL1 (i.e. Irc10=0), the OTP memory cell C00 is verified to have the second storage state.

As shown in FIG. 10B, the voltage Vdd is provided to word line WL1, and 0V is provided to the word lines WL0 and WL2. Moreover, 0V is provided to the bit lines BL0 and BL1. In other words, the OTP memory cells C01 and C11 are the selected memory cells. Since the OTP memory cell C01 does not generate the read current to the bit line BL0 (i.e. Irc01=0), the OTP memory cell C01 is verified to have the second storage state. On the other hand, since the OTP memory cell C11 is the failed memory cell, the read current Irc11 generated by the OTP memory cell C11 is very small. Under this circumstance, the OTP memory cell C11 is erroneously judged to have the second storage state.

As shown in FIG. 10C, the voltage Vdd is provided to word line WL2, and 0V is provided to the word lines WL0 and WL2. Moreover, 0V is provided to the bit lines BL0 and BL1. In other words, the OTP memory cells C02 and C12 are the selected memory cells. Since the OTP memory cell C02 generates the higher read current Irc02 to the bit line BL0, the OTP memory cell C02 is verified to have the first storage state. Whereas, since the OTP memory cell C12 does not generate the read current to the bit line BL1 (i.e. Irc12=0), the OTP memory cell C12 is verified to have the second storage state.

From the above discussions, the OTP memory cell C11 is erroneously judged to have the second storage state after the verification cycle. In fact, the OTP memory cell C11 is in the first storage state. In other words, the OTP memory cell C11 is verified as the failed memory cell.

In the case that the failed memory cell is found after the verification cycle, a second program process is performed. During the second program cycle, the voltage Vdd is provided to the first program line PL1, the third program line PL3 and the fifth program line PL5, and the voltage Vpp is provided to the second program line PL2, the fourth program line PL4 and the sixth program line PL6. Similarly, during the second program cycle, if the word line WL and the bit line BL corresponding to a specified OTP memory cell receive the voltage Vdd and the zero voltage (0V), respectively, the specified OTP memory cell is the selected memory cell. Hereinafter, the procedure of remedying the failed memory cell during the second program cycle will be illustrated with reference to FIG. 11. In an embodiment, the magnitude of the voltage Vpp is 6V, and the magnitude of the voltage Vdd is in the range between 1V and 2.8V.

Figure 11:
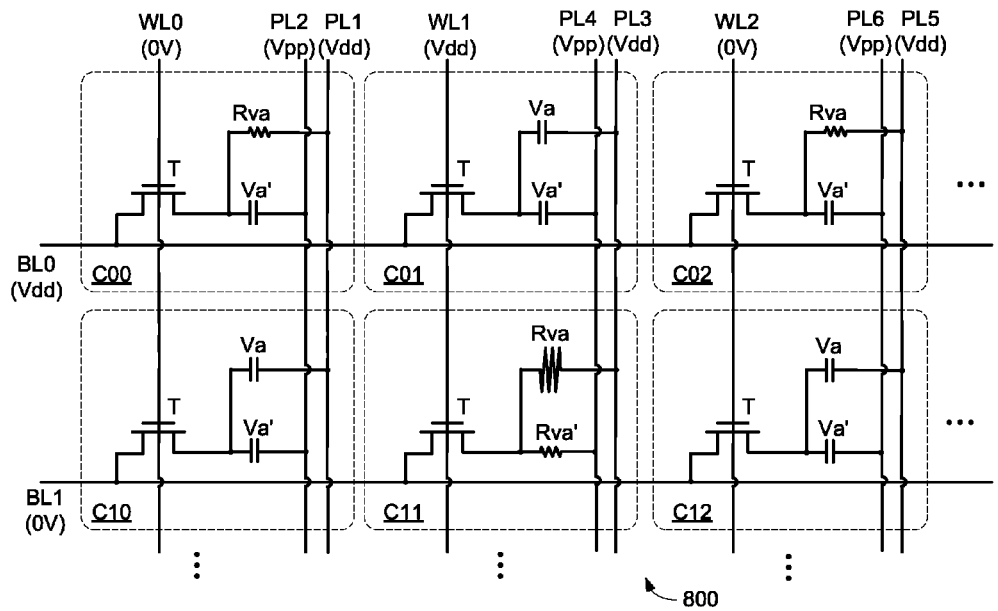
FIG. 11 schematically illustrates a procedure of remedying the failed memory cell during a second program cycle.

FIG. 11 schematically illustrates a procedure of remedying the failed memory cell during a second program cycle. During the second program cycle, the voltage Vdd is provided to word line WL1, and 0V is provided to the word lines WL0 and WL2. Moreover, the voltage Vdd is provided to the bit line BL0, and 0V is provided to the bit line BL1. In other words, the OTP memory cell C11 is the selected memory cell. Consequently, the varactor Va' of the OTP memory cell C11 is turned into a resistor Rva'. Under this circumstance, the failed memory cell is remedied as the programmed memory cell.

Figure 12:
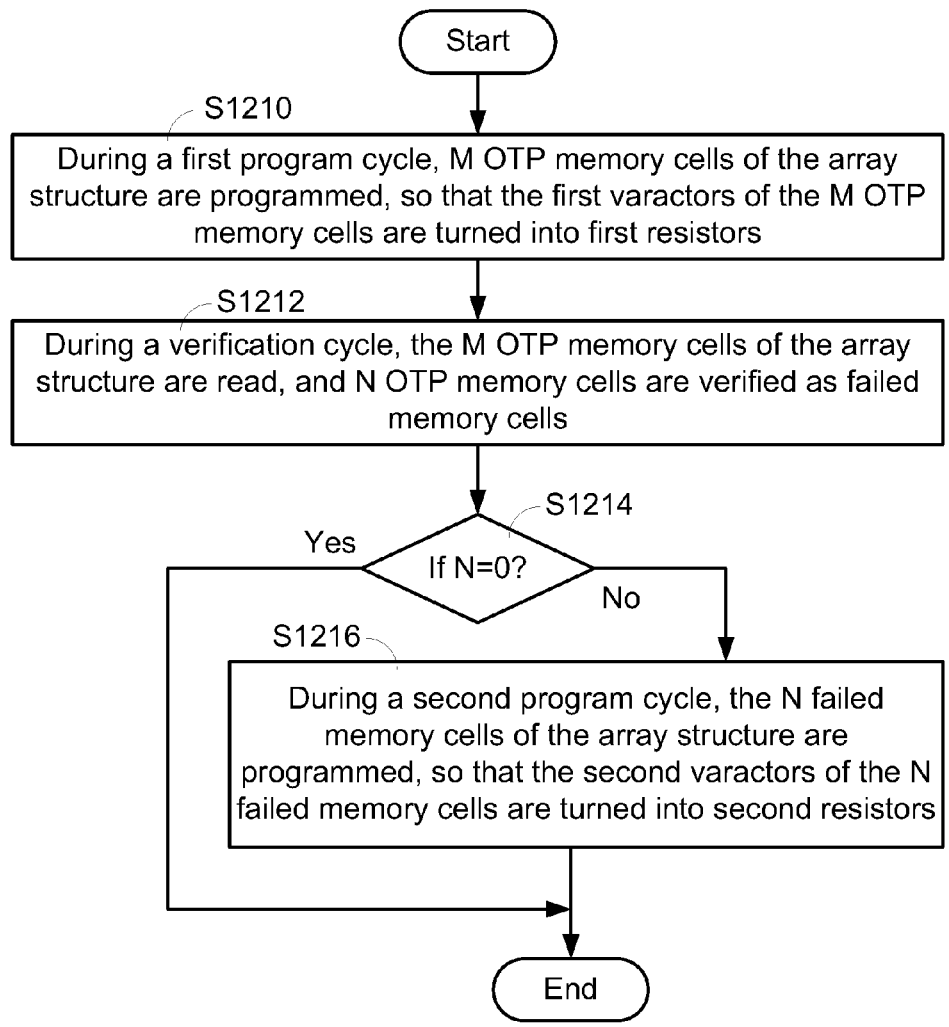
FIG. 12 is a flowchart illustrating an operating method of an array structure according to an embodiment of the present invention.

The present invention further provides an operating method of an array structure. FIG. 12 is a flowchart illustrating an operating method of an array structure according to an embodiment of the present invention.

Firstly, a first program process is performed. During a first program cycle, M OTP memory cells of the array structure are programmed, so that the first varactors of the M OTP memory cells are turned into first resistors (Step S1210).

Then, a verification process is performed. During a verification cycle, the M OTP memory cells of the array structure are read, and N OTP memory cells are verified as failed memory cells (Step S1212).

Then, a step S1214 is performed to judge whether N is 0.

If N is not 0, a second program process is performed. During a second program cycle, the N failed memory cells of the array structure are programmed, so that the second varactors of the N failed memory cells are turned into second resistors (Step S1216). Then, the flowchart is ended.

If N is 0, the flowchart is ended directly.

From the above descriptions, the present invention provides a one time programming memory cell, an array structure and an operating method thereof. Each OTP memory cell of the array structure of the present invention comprises two varactors. In case that the gate oxide layer of the first varactor Va cannot be successfully ruptured during the first program cycle, the gate oxide layer of the second varactor Va' will be ruptured during the second program cycle. Consequently, the failed memory cell is turned into the programmed memory cell. In other words, the in-cell 100% redundancy efficacy can be achieved.

Figure 13:
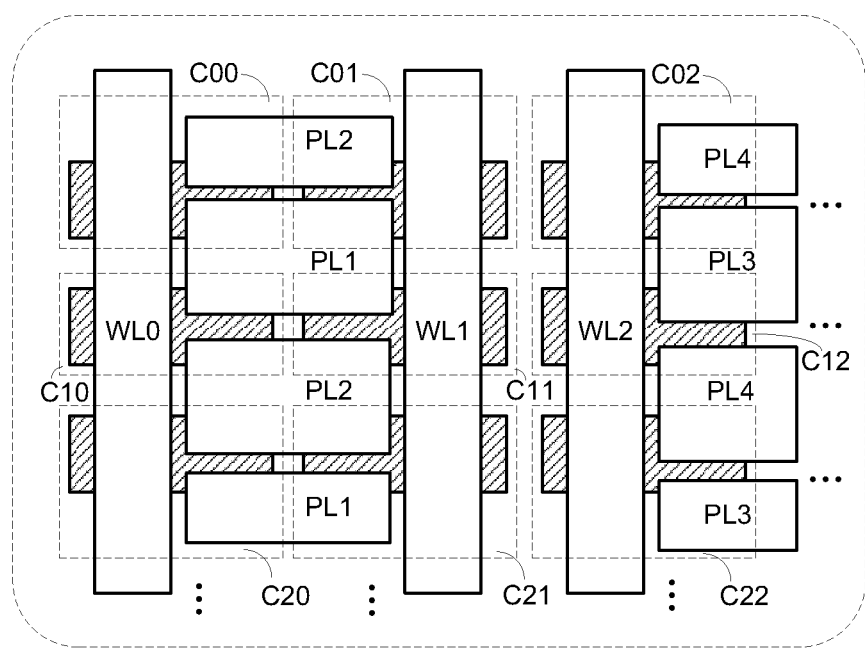
FIG. 13 is a schematic top view illustrating the layout of an array structure of OTP memory cells according to a second embodiment of the present invention.

Furthermore, FIG. 13 is a schematic top view illustrating the layout of an array structure of OTP memory cells according to a second embodiment of the present invention. In FIG. 13, each OTP memory cell is circumscribed by a dotted rectangle. In comparison with the structure of FIG. 8A, the connection relationship between the first program line PL1, the second program line PL2 and the adjacent memory cells of the structure of this embodiment are distinguished. As shown in FIG. 13, the second polysilicon gates of the second gate structures of the OTP memory cells C00, C10, C01 and C11 are combined together and connected with the first program line PL1, and the third polysilicon gates of the third gate structures of the OTP memory cells C10, C20, C11 and C21 are combined together and connected with the second program line PL2.

After the structure of FIG. 13 is produced, a channel cancellation process is performed. The channel cancellation process is for example a source/drain extension process, a well forming process or an ion implantation process. After the channel cancellation process is performed, the channel regions of the second gate structures and the third gate structures are cancelled, and the NMOS capacitors are turned into varactors. Consequently, the array structure of this embodiment is manufactured.

Furthermore, the second embodiment has the same bias voltages with the first embodiment during the first program cycle, the verification cycle and the second program cycle. The flow chart shown in FIG. 12 is capable of applying to the second embodiment, and is not redundantly described herein.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An operating method of an array structure, the array structure having a first one time programming memory cell comprising: a first transistor having a gate terminal connected with a first word line, a source terminal connected with a first bit line and a drain terminal, a first varactor having a first end connected with the drain terminal of the first transistor and a second end connected with a first program line, and a second varactor having a third end connected with the drain terminal of the first transistor and a fourth end connected with a second program line, the operating method comprising steps of:

performing a first program process to turn the first varactor of the first one time programming memory cell into a first resistor;

performing a verification process to read a first read current of the first one time programming memory cell; and judging whether the first one time programming memory cell is a failed memory cell according to the first read current, wherein if the first one time programming memory cell is verified as the failed memory cell, a second program process is performed to turn the second varactor of the first one time programming memory cell into a second resistor.

2. The operating method as claimed in claim 1, wherein if the first read current is lower than a reference current, the first one time programming memory cell is verified as the failed memory cell.

* * * * *